(12) United States Patent
Iizuka

(10) Patent No.: US 10,658,343 B2
(45) Date of Patent: May 19, 2020

(54) SEMICONDUCTOR MODULE INCLUDING PRESSURE CONTACT ADJUSTMENT SCREWS

(71) Applicant: Fuji Electric Co., Ltd., Kanagawa (JP)

(72) Inventor: Yuji Iizuka, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 106 days.

(21) Appl. No.: 15/803,706

(22) Filed: Nov. 3, 2017

(65) Prior Publication Data

US 2018/0175007 A1    Jun. 21, 2018

(30) Foreign Application Priority Data

Dec. 16, 2016 (JP) ................. 2016-244452

(51) Int. Cl.
*H01L 25/07* (2006.01)
*H01L 23/32* (2006.01)
(Continued)

(52) U.S. Cl.
CPC .......... *H01L 25/072* (2013.01); *H01L 23/32* (2013.01); *H01L 23/492* (2013.01); *H01L 24/72* (2013.01);
(Continued)

(58) Field of Classification Search
CPC ..... H01L 25/072; H01L 23/32; H01L 23/492; H01L 23/4006; H01L 2023/4087
See application file for complete search history.

(56) References Cited

U.S. PATENT DOCUMENTS 4,499,485 A * 2/1985 Schierz ................... H01L 23/32
257/709
8,087,943 B2 * 1/2012 Stolze ................... H01L 25/072
439/83
(Continued)

FOREIGN PATENT DOCUMENTS

JP    2002-176133 A    6/2002
JP    2009-267246 A    11/2009
(Continued)

*Primary Examiner* — Matthew E. Gordon
(74) *Attorney, Agent, or Firm* — Chen Yoshimura LLP

(57) ABSTRACT

A pressure contact-type semiconductor module includes a plurality of semiconductor units disposed side-by-side, each of the semiconductor units including: a semiconductor device substrate; a first electrode formed below the semiconductor device substrate, a second electrode formed above the semiconductor device substrate, an electrode plate electrically connected to the second electrode; and a pressure contact adjustment member screwed into the electrode plate, the pressure contact adjustment member having a top surface as a pressure contact-receiving surface to which a lead-out electrode plate that is common to the plurality of semiconductor units is to be pressure-contacted, levels of the respective top surfaces of the pressure contact adjustment members in the plurality of semiconductor units being adjustable to match a reference pressure contact plane so that contact pressures in the respective top surfaces applied by the lead-out electrode plate are substantially the same among the semiconductor units.

11 Claims, 4 Drawing Sheets

(51) Int. Cl.
*H01L 23/492* (2006.01)
*H01L 25/11* (2006.01)
*H01L 23/00* (2006.01)

(52) U.S. Cl.
CPC ........ *H01L 25/115* (2013.01); *H01L 2224/01* (2013.01); *H01L 2924/181* (2013.01); *H01L 2924/1815* (2013.01)

(56) References Cited

U.S. PATENT DOCUMENTS

| | | |
|---|---|---|
| 9,312,192 B2 | 6/2016 | Iizuka et al. |
| 9,379,083 B2 | 6/2016 | Iizuka et al. |
| 9,385,061 B2 | 7/2016 | Nakamura et al. |
| 9,478,477 B2 * | 10/2016 | Iizuka .................. H01L 23/367 |
| 2009/0261472 A1 * | 10/2009 | Bayerer ................ H01L 24/06 |
| | | 257/719 |
| 2016/0005670 A1 * | 1/2016 | Iizuka ................ H01L 23/4006 |
| | | 257/693 |
| 2018/0122782 A1 * | 5/2018 | Weidner ............... H01L 25/072 |

FOREIGN PATENT DOCUMENTS

| | | |
|---|---|---|
| JP | 2015-50267 A | 3/2015 |
| JP | 2016-86186 A | 5/2016 |
| WO | 2015/025447 A1 | 2/2015 |

\* cited by examiner

SEMICONDUCTOR MODULE INCLUDING PRESSURE CONTACT ADJUSTMENT SCREWS

BACKGROUND OF THE INVENTION

Technical Field

The present invention relates to a pressure contact-type semiconductor module equipped with a power semiconductor chip.

Background Art

Power semiconductor modules are used in inverter devices, uninterruptible power supplies, machine tools, industrial robots, and the like.

One known example of a conventional power semiconductor module is disclosed in Patent Document 1, for example.

The power semiconductor module disclosed in Patent Document 1 includes a support plate having a plurality of penetrating holes that pass through both the first surface and second surface, which are opposite to each other, and a plurality of semiconductor units that are fixed to the first surface of the support plate and that have semiconductor chips and protruding metal blocks, the metal blocks passing through the penetrating holes to the second surface. The semiconductor units include connecting terminals that protrude in a direction opposite to the metal block.

In this manner, the plurality of semiconductor units are included in the power semiconductor module, and the connecting terminals of the plurality of semiconductor units are wired together on the side opposite the metal blocks, thereby realizing increased capacity.

However, in the power semiconductor module disclosed in Patent Document 1, the connecting terminals all protrude towards the side opposite to the metal blocks, and thus, the wiring length of the electrodes closer to the metal blocks increases, which also increases the wiring inductance. Thus, Patent Document 1 has an unsolved problem that the semiconductor chip is vulnerable to damage resulting from surge voltage and the like.

Pressure contact-type semiconductor modules disclosed in Patent Documents 2 and 3 are proposed as semiconductor modules with a low inductance structure that reduces the wiring inductance.

In the pressure contact-type semiconductor module disclosed in Patent Document 2, three solder plates having the role of thickness adjustment plates are disposed above and below the semiconductor chip. A heat cushioning plate is fixed both above and below the semiconductor chip, respectively, with the three solder plates therebetween, and this entire structure is sandwiched between a pressure contact plate that is a collector electrode plate and a pressure contact plate that is an emitter electrode plate. By melting and solidifying the three solder plates under pressure, the semiconductor chips are fixed to the heat cushioning plates while at the same time a uniform thickness is provided for the entirety of the semiconductor chip, the multiple solder plates, and the heat cushioning plates, and uniform pressure is applied to the plurality of semiconductor chips disposed between the pressure contact electrode plates.

The pressure contact-type semiconductor module disclosed in Patent Document 3 includes a plurality of semiconductor elements and two terminal plates that are in pressure contact with both front and rear surfaces of a plurality of semiconductor chips, and a plurality of columnar electrode parts are formed on the surfaces of the electrodes of the respective semiconductor chips. Heat-dissipating plates that retain the two terminal plates under pressure are provided, and the plurality of columnar electrode parts undergo plastic deformation so as to be in sliding contact with the terminal plates.

In this manner, both upper and lower electrode plates are disposed in the pressure contact-type semiconductor module, and thus, the wiring distance is shorter compared to a case in which an electrode plate is disposed only on one of the upper and lower surfaces. Thus, the wiring inductance is reduced.

RELATED ART DOCUMENTS

Patent Documents

Patent Document 1: WO 2015/025447
Patent Document 2: Japanese Patent Application Laid-Open Publication No. 2002-176133.
Patent Document 3: Japanese Patent Application Laid-Open Publication No. 2009-267246

SUMMARY OF THE INVENTION

However, in the pressure contact-type power semiconductor module disclosed in Patent Document 2, the three solder plates are melted and solidified in a pressurized state, which poses the unsolved problem that it is difficult to have a precisely uniform thickness for the entirety of the semiconductor chips, multiple solder plates, and the heat cushioning plates, and to apply more uniform pressure.

Furthermore, in the pressure contact-type power semiconductor module disclosed in Patent Document 3, the columnar electrode parts are plastically deformed, which poses the unsolved problem that localized stress is applied to the surface of the electrodes of the semiconductor chips.

The present invention was made in view of the problems of the above-mentioned conventional examples, and an object thereof is to provide a pressure contact-type semiconductor module by which it is possible to accurately set the pressure contact-receiving surfaces of the plurality of semiconductor units so as to be on the same plane. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a pressure contact-type semiconductor module, including: a plurality of semiconductor units disposed side-by-side, each of the semiconductor units including: a semiconductor device substrate; a first electrode formed below the semiconductor device substrate, the first electrode being electrically connected to the semiconductor device substrate; a second electrode formed above the semiconductor device substrate, the second electrode being electrically connected to the semiconductor device substrate; an electrode plate electrically connected to the second electrode; and a pressure contact adjustment member screwed into the electrode plate, the pressure contact adjustment member having a top surface as a pressure contact-receiving surface to which a lead-out electrode plate that is common to the plurality of semiconductor units is to be pressure-contacted, wherein the respective pressure contact adjustment members are screwed into the corresponding electrode plates such that levels of the respective top surfaces of the pressure contact adjustment members in the plurality of semiconductor units are adjustable to match a reference pressure contact plane so that contact pressures in the respective top surfaces applied by the lead-out electrode plate are substantially the same among the plurality of semiconductor units.

According to the present invention, it is possible to accurately adjust the height of the pressure contact-receiving surface of each semiconductor unit by screw thread engagement, and it is possible to have the pressure contact-receiving surfaces of a plurality of semiconductor units be in the same plane. Therefore, it is possible to apply uniform pressure without any localized high pressure contact force applied on each semiconductor unit, and the pressure contact load can also be reduced. It is to be understood that both the foregoing general description and the following detailed description are exemplary and explanatory, and are intended to provide further explanation of the invention as claimed.

DETAILED DESCRIPTION OF EMBODIMENTS

Figure 1:
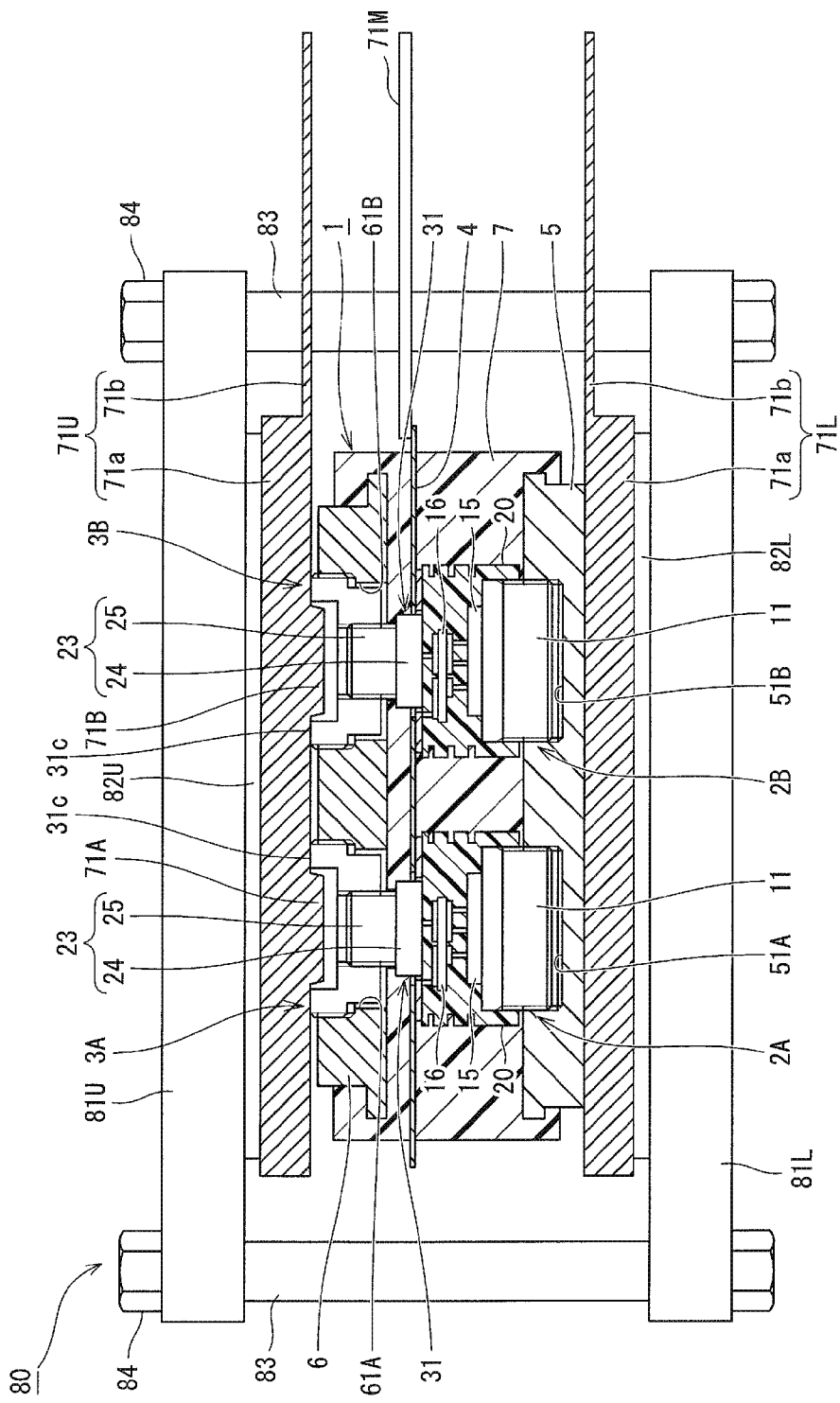
FIG. 1 is a cross-sectional view showing Embodiment 1 of a pressure contact-type semiconductor module according to the present invention.

An embodiment of the present invention will be described below with reference to the drawings. In the drawings below, portions that are the same or similar are assigned the same or similar reference characters. However, the drawings are schematic, and it should be noted that the relationship between the thickness and planar dimensions, the ratio of thicknesses of the respective layers, and the like differ from practice. Therefore, one should determine specific thicknesses and dimensions with reference to the description below. Dimensional relationships and ratios of corresponding portions naturally differ in part among the drawings.

The embodiments described below illustrate an example of a device and method for realizing the technical concept of the present invention, and the technical concept of the present invention is not limited to the embodiments below in terms of the material, the shape, the structure, arrangement of the components, and the like. Various modifications can be made to the technical concept of the present invention within the technical scope of the claims defined in the claims section.

Embodiment 1

Below, Embodiment 1 of a pressure contact-type semiconductor module according to the present invention will be described with reference to drawings.

As shown in FIG. 1, the pressure contact-type semiconductor module of the present invention includes a semiconductor device 1, and an external pressure contact mechanism 80 that is in pressure contact with the semiconductor device 1.

Figure 2:
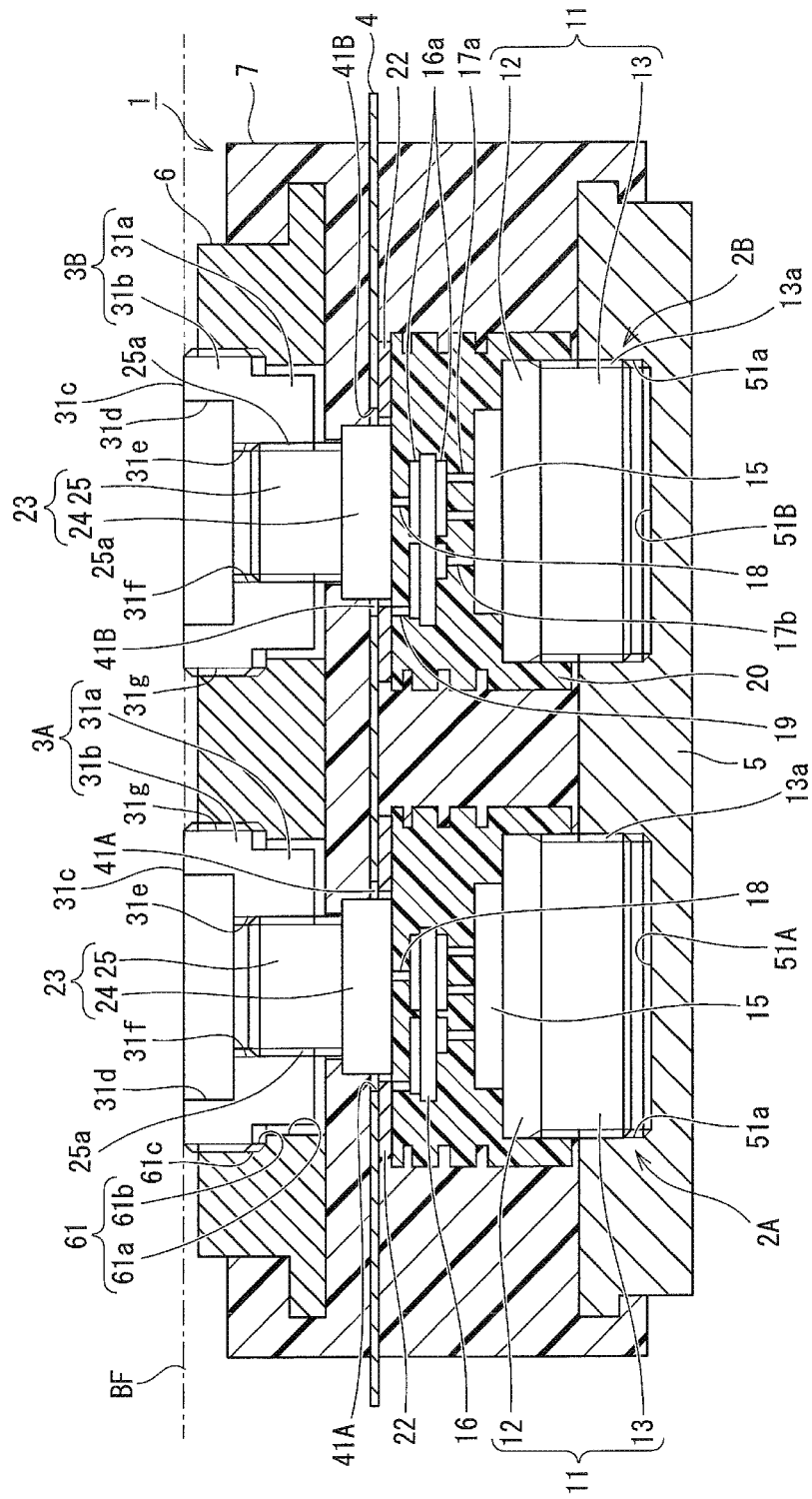
FIG. 2 is an expanded cross-sectional view showing a semiconductor device of FIG. 1.

As shown in FIG. 2, for example, the semiconductor device 1 includes two semiconductor units 2A and 2B having the same configuration, pressure contact adjustment members 3A and 3B, a control electrode plate 4, a first pressure contact electrode plate 5, a second pressure contact electrode plate 6, and a resin sealing material 7.

<Configuration of Semiconductor Unit>

Figure 3:
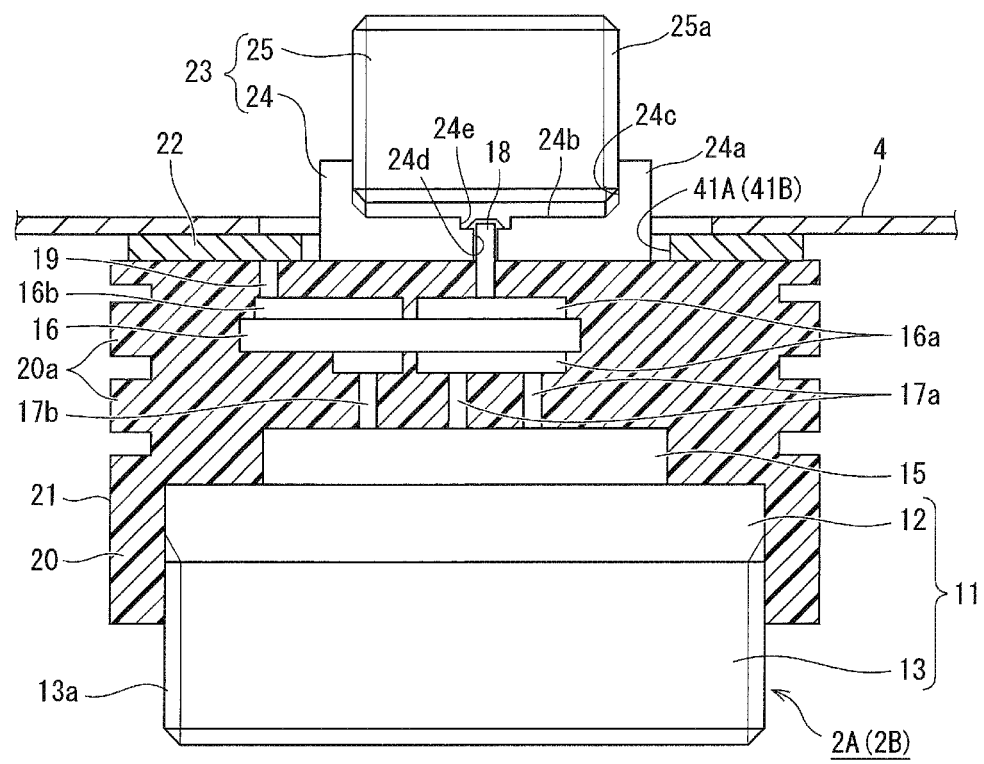
FIG. 3 is an expanded cross-sectional view showing a semiconductor unit of FIG. 1.

As shown in FIGS. 2 and 3, the semiconductor units 2A and 2B each have a base substrate 11. The base substrate 11 includes a wiring pattern plate 12 made of relatively thick copper, and a first electrode 13 similarly made of copper that is formed on the bottom surface of the wiring pattern plate 12.

On the wiring pattern plate 12, a power semiconductor chip 15 (i.e., a semiconductor device substrate) such as an insulating gate bipolar transistor (IGBT) constituted of a wide bandgap semiconductor such as SiC, or a power MOSFET (power metal-oxide semiconductor field-effect transistor) is mounted, for example.

The first electrode 13 is formed in the shape of a cylinder having a larger diameter than height, and a male screw portion 13a is formed by machining the outer surface thereof.

In addition, above the semiconductor chip 15, a wiring substrate 16 is disposed so as to be parallel thereto and at a prescribed gap therefrom. The wiring substrate 16 has formed thereon wiring patterns 16a and 16b that form the wired connections of the semiconductor chip 15. Moreover, the wiring substrate 16 has formed thereon post electrodes 17a that are electrically connected to the emitter and source electrode formed on the top surface of the semiconductor chip 15, and a post electrode 17b that is in direct contact with the gate electrode formed on the top surface of the semiconductor chip 15.

Additionally, a columnar conductor 18 that serves as a second electrode extending upward is formed on the wiring pattern 16a on the top surface of the wiring substrate 16. Furthermore, a columnar conductor 19 that serves as a control electrode extending upward is formed on the wiring pattern 16b on the top surface of the wiring substrate 16.

The base substrates 11, the semiconductor chips 15, and the wiring substrates 16 are covered in a resin sealing material 20 made of a thermosetting resin material such as an epoxy resin. The resin sealing material 20 extends upward along the outer periphery of the top of the first electrode 13 of the base substrate 11, and has formed in the outer side face thereof recesses and protrusions 20a that ensure creepage distance for dimensional constraint. It is preferable that the outer peripheral surface of the resin sealing material 20 have formed thereon a surface protective film 21 constituted of an inorganic material such as $Al_2O_3$, AlN, $Si_3N_4$, $SiO_2$, or BN. In terms of the form for ensuring creepage distance for dimensional constraint on the outer side face, in addition to the recesses and protrusions 20a, penetrating holes for increasing adhesion with the resin sealing material 7 may be formed.

The first electrode 13 protrudes lower than the bottom surface of the resin sealing material 20, and the columnar conductor 18 serving as the second electrode protrudes upward by a prescribed length from the top surface of the resin sealing material 20. The columnar conductor 19 is exposed on the same plane as the top surface of the resin sealing material 20. The columnar conductor 19 is electrically connected to an annular electrode pattern 22 formed on the top surface of the resin sealing material 20.

The semiconductor units 2A and 2B each include an electrode plate 23 that is disposed on the resin sealing material 20 and is electrically connected to the columnar conductor 18. As shown in FIGS. 2 and 3, the electrode plate 23 includes an electrode plate portion 24 and a male screw member 25.

As shown in FIG. 3, the electrode plate portion 24 is made of a conductive metal material, and has the form of a bottomed tube that includes a cylindrical portion 24a and a bottom portion 24b that closes off the bottom end of the cylindrical portion 24a, with the top end being open. The inner peripheral surface of the cylindrical portion 24a has formed therein a female screw portion 24c. In the center of the bottom portion 24b, a fixing hole 24d that penetrates both bottom and top surfaces of the bottom portion 24b is formed. The columnar conductor 18 projecting from the resin sealing material 20 is inserted into the fixing hole 24d and fixed therein. Here, the thickness of the bottom portion 24b is set to be greater than or equal to the projecting length of the columnar conductor 18 from the resin sealing material 20. In addition, a counterbore section 24e is formed at the top end of the fixing hole 24d.

As shown in FIG. 3, the electrode plate portion 24 is placed on the top surface of the resin sealing material 20 in a state in which the columnar conductor 18 passes through the fixing hole 24d and the tip of the columnar conductor 18 protrudes into the counterbore section 24e, and the tip of the columnar conductor 18 and the electrode plate portion 24 are integrated in the counterbore section 24e by localized heat welding such as laser welding and electrically connected to each other.

As shown in FIGS. 2 and 3, in the male screw member 25, the male screw portion 25a formed on the outer peripheral surface thereof is screwed together with the female screw portion 24c of the electrode plate portion 24

<Configuration of Pressure Contact Adjustment Member>

As shown in FIGS. 1 and 2, the pressure contact adjustment members 3A and 3B are formed in a reverse convex ring shape in which a small diameter portion 31a on the bottom and a large diameter portion 31b on the top are connected to each other. The top surface of the large diameter portion 31b is a pressure contact-receiving surface 31c that receives a pressure contact force from the external pressure contact mechanism 80. A recess 31d is formed from the top surface of the large diameter portion 31b, and a penetrating hole 31e is formed in the small diameter portion 31a from the center part of the bottom surface to the recess 31d. On the inner peripheral surface of the penetrating hole 31e, a female screw portion 31f that is screwed together with the male screw member 25 of the electrode plate 23 is formed. Furthermore, a male screw portion 31g is formed on the outer peripheral surface of the large diameter portion 31b.

In the pressure contact adjustment members 3A and 3B, the height of the pressure contact-receiving surface 31c from the electrode plate 23 can be adjusted by the female screw 31e being screwed together with the male screw portion 25a of the male screw member 25 in the electrode plate 23 of the semiconductor units 2A and 2B.

<Configuration of Control Electrode Plate>

As shown in FIGS. 2 and 3, the control electrode plate 4 is formed of a conductive metal material in a flat plate shape, and has penetrating holes 41A and 41B through which the electrode plate portions 24 of the electrode plates 23 of the semiconductor units 2A and 2B can penetrate without making contact. In the control electrode plate 4, the electrode plate portions 24 of the semiconductor units 2A and 2B are inserted into the penetrating holes 41A and 41B without making contact, and the bottom surface of the control electrode plate 4 is arranged so as to be in contact with the annular electrode patterns 22 of the semiconductor units 2A and 2B.

<Configuration of First Pressure Contact Electrode Plate>

As shown in FIGS. 1 and 2, the first pressure contact electrode plate 5 is formed of a conductive metal material in a flat plate shape. The first pressure contact electrode plate 5 has formed in the top surface thereof junction recesses 51A and 51B that join the semiconductor units 2A and 2B with a prescribed gap therebetween, left and right. A female screw portion 51a that is screwed together with the male screw portion 13a of the first electrode 13 of each of the semiconductor units 2A and 2B is formed in the inner peripheral surface of each junction recess 51A and 51B. The female screw portions 51a of both junction recesses 51A and 51B are screwed together with the male screw portions 13a of the first electrodes 13 of the semiconductor units 2A and 2B.

<Configuration of Second Pressure Contact Electrode Plate>

As shown in FIGS. 1 and 2, the second pressure contact electrode plate 6 has formed therein junction attachment holes 61A and 61B that join the pressure contact adjustment members 3A and 3B arranged on the top surface of the semiconductor units 2A and 2B, which are joined to the first pressure contact electrode plate 5. Both junction attachment holes 61A and 61B have formed therein small diameter portions 61a through which small diameter portions 31a of the pressure contact adjustment members 3A and 3B are inserted, and large diameter portions 61b through which large diameter portions 31b of the pressure contact adjustment members 3A and 3B are inserted. The large diameter portions 61b have formed therein female screw portions 61c that are screwed together with the male screw portions 31g of the pressure contact adjustment members 3A and 3B.

The second pressure contact electrode plate 6 is joined to the electrode plates 23 of the semiconductor units 2A and 2B through the pressure contact adjustment members 3A and 3B. This junction is initially maintained in a state in which the male screw members 25 of the electrode plates 23 are coaxial with the junction attachment holes 61A and 61B of the second pressure contact electrode plate 6 while being therein. In this state, with the pressure contact adjustment members 3A and 3B being above the second pressure contact electrode plate 6, the female screw portions 31f are screwed together with the male screw portions 25a of the male screw members 25, and the male screw portions 31g are screwed together with the female screw portions 61c of the second pressure contact electrode plate 6, such that the second pressure contact electrode plate 6 is joined with the electrode plates 23 of the semiconductor units 2A and 2B through the pressure contact adjustment members 3A and 3B.

The areas surrounding the semiconductor units 2A and 2B, the control electrode plate 4, the first pressure contact electrode plate 5, and the second pressure contact electrode plate 6 are sealed by the resin sealing material 7 in a state in which the pressure contact-receiving surfaces 31c of the pressure contact adjustment members 3A and 3B, the bottom surface of the first pressure contact electrode plate 5, and the top surface of the second pressure contact electrode plate 6 are exposed, thereby configuring the semiconductor device 1.

In the semiconductor device 1, the pressure contact-receiving surfaces 31*c* of the pressure contact adjustment members 3A and 3B and the top surface of the second pressure contact electrode plate 6 are exposed at the top through the resin sealing material 7 in a state in which the semiconductor device 1 is sealed by the resin sealing material 7. Furthermore, the pressure contact adjustment members 3A and 3B are screwed together with both the male screw members 25 constituting the electrode plates 23 and the second pressure contact electrode plate 6 of the semiconductor units 2A and 2B. Thus, the pressure contact adjustment members 3A and 3B can be rotated clockwise and counterclockwise in a plan view, and can adjust the projecting height of the pressure contact-receiving surfaces 31*c*. That is, by rotating the pressure contact adjustment members 3A and 3B clockwise, the pressure contact-receiving surfaces 31*c* are lowered, and by rotating the pressure contact adjustment members counterclockwise, the pressure contact-receiving surfaces 31*c* are raised.

Therefore, by adjusting the pressure contact adjustment members 3A and 3B, both pressure contact-receiving surfaces 31*c* of the pressure contact adjustment members 3A and 3B can be accurately matched to a reference pressure contact plane BF indicated by the one-dot-chain line in FIG. 2 that was set at a prescribed distance from the bottom surface of the first pressure contact electrode plate 5. Once height adjustment for the pressure contact-receiving surfaces 31*c* is completed, as shown in FIG. 1 the semiconductor device 1 is joined together under pressure by the external pressure contact mechanism 80 to form a semiconductor stack in a state in which a first lead-out electrode plate 71L having a large area is brought into contact with the bottom surface of the first pressure contact electrode plate 5 and a second lead-out electrode plate 71U having a large area is brought into contact with the pressure contact-receiving surfaces of the pressure contact adjustment members 3A and 3B.

Here, the first lead-out electrode plate 71L is in contact with the bottom surface of the first pressure contact electrode plate 5 of the semiconductor device 1. The first lead-out electrode plate 71L is constituted by a thick electrode portion 71*a* having a large thickness, and a lead-out electrode portion 71*b* with a small thickness that protrudes rightward from the right side face of the thick electrode portion 71*a*, for example.

The second lead-out electrode plate 71U is in contact with the pressure contact-receiving surfaces 31*c* of the pressure contact adjustment members 3A and 3B of the semiconductor device 1. Similar to the first lead-out electrode plate 71L, the second lead-out electrode plate 71U is also constituted by a thick electrode portion 71*a* having a large thickness, and a lead-out electrode portion 71*b* with a small thickness that protrudes rightward from the right side face of the thick electrode portion 71*a*, for example.

The second lead-out electrode plate 71U has formed thereon engaging protrusions 71A and 71B that engage with the recesses 31*d* of the pressure contact adjustment members 3A and 3B. By the engaging protrusions 71A and 71B engaging with the recesses 31*d* of the pressure contact adjustment members 3A and 3B, the pressure contact adjustment members 3A and 3B and the second lead-out electrode plate 71U of the semiconductor device 1 can be positioned with respect to each other.

The control electrode plate 4 is joined to a lead-out electrode plate 71M that extends in the horizontal direction.

The external pressure contact mechanism 80 is provided with a first pressurizing support plate 81L and a second pressurizing support plate 81U, and stud bolts 83 that connect the first pressurizing support plate 81L and the second pressurizing support plate 81U so as to sandwich the semiconductor device 1 therebetween.

The first pressurizing support plate 81L is configured in a flat plate shape with a larger area than the first lead-out electrode plate 71L, and contacts the bottom surface of the first lead-out electrode plate 71L with an insulating plate 82L therebetween.

The second pressurizing support plate 81U is configured in a flat plate shape with a larger area than the second lead-out electrode plate 71U, and contacts the top surface of the second lead-out electrode plate 71U with an insulating plate 82U therebetween.

The stud bolts 83 penetrate the four corners of the first pressurizing support plate 81L and the second pressurizing support plate 81U, and are arranged so as to pass to the outside of the semiconductor device 1. Fixing nuts 84 are screwed onto the tips of the respective stud bolts 83 protruding through the second pressurizing support plate 81U. By screwing each of in the fixing nuts 84 with a prescribed torque, the necessary pressure contact force can be made to act on the semiconductor device 1 between the first pressurizing support plate 81L and the second pressurizing support plate 81U.

According to Embodiment 1, the first electrodes 13 protrude from one of a pair of opposite surfaces of the semiconductor units 2A and 2B, and the columnar conductors 18 that are the second electrodes protrude from the other surface and are joined to the electrode plates 23. The first electrodes 13 are joined to the first pressure contact electrode plate 5, and the electrode plates 23 are joined to the second pressure contact electrode plate 6.

Therefore, the first pressure contact electrode plate 5 and the second pressure contact electrode plate 6 are arranged on opposing surfaces of the semiconductor units 2A and 2B, and the wiring length in the semiconductor units 2A and 2B to the first pressure contact electrode plate 5 and the second pressure contact electrode plate 6 can be shortened, thereby reducing the wiring inductance in the semiconductor units 2A and 2B.

The electrode plates 23 are connected to the columnar conductors 18 of the semiconductor units 2A and 2B protruding through the resin sealing material 20 and the pressure contact adjustment members 3A and 3B are joined to the electrode plates 23, and thus, it is possible to join with ease the second pressure contact electrode plate 6 and the second lead-out electrode plate 71U through the pressure contact adjustment members 3A and 3B, which allows for an increase in wiring necessary for increased capacity.

Furthermore, the pressure contact adjustment members 3A and 3B are screwed into the electrode plates 23 of the semiconductor units 2A and 2B, and thus, the pressure contact-receiving surfaces 31*c* formed on the pressure contact adjustment members 3A and 3B can be matched with the reference pressure contact plane set in advance to a high degree of accuracy of several dozen micrometers. Thus, it is possible for the pressure contact-receiving surfaces 31*c* of the pressure contact adjustment members 3A and 3B to contact the second lead-out electrode plate 71U uniformly and with high accuracy, and thus, it is possible to prevent the pressure contact force on the pressure contact-receiving surfaces 31c of the pressure contact adjustment members 3A and 3B from becoming too high in localized areas.

Therefore, it is possible to uniformly abut the pressure contact-receiving surfaces 31c of the pressure contact adjustment members 3A and 3B with the second lead-out electrode plate in a state in which the pressure contact load is reduced, and it is possible to achieve a configuration with decreased inductance in wiring necessary for improvement in dynamic characteristics. Additionally, the structure allows for uniformity of the semiconductor units in the interior, and thus, it is possible to produce at low cost a semiconductor device for which systemization of a plurality of ratings is desired.

By screwing the male screw portions 13a of the first electrodes 13 of the semiconductor units 2A and 2B together with the female screw portions 51a formed in the inner peripheral surface of the junction recesses 51A and 51B formed in the first pressure contact electrode plate 5, it is possible to electrically and mechanically join the semiconductor units 2A and 2B to the large area first pressure contact electrode plate 5.

On the other hand, the electrode plates 23 are joined by localized heat welding such as laser welding to the columnar conductors 18 of the semiconductor units 2A and 2B protruding through the resin sealing material 20, and thus, it is possible to integrally and robustly join the columnar conductors 18 with the electrode plates 23 while suppressing the amount of heat transmitted to the semiconductor units 2A and 2B during welding.

Furthermore, the welding of the columnar conductors 18 with the electrode plates 23 is performed in the counterbore sections 24e, and thus, the weld overlay formed during the localized heat welding does not rise above the top surface of the bottom portions 24b, and when the male screw members 25 are screwed into the cylindrical portions 24a of the electrode plates 23, the tips of the male screw members 25 can be reliably abutted to the top surface of the bottom portions 24b. Thus, it is possible to set the protrusion heights of the male screw members 25 from the electrode plates 23 to be uniform.

By the pressure contact adjustment members 3A and 3B being screwed in between the male screw members 25 and the junction attachment holes 61A and 61B of the second pressure contact electrode plate 6, the pressure contact adjustment members 3A and 3B can be mechanically joined to the second pressure contact electrode plate 6 such that the height is adjustable in a state of being reliably connected electrically.

Therefore, it is possible to electrically and mechanically connect the first electrodes 13 and the columnar conductors 18 serving as the second electrode of the semiconductor units 2A and 2B to the first pressure contact electrode plate 5 and the second pressure contact electrode plate 6 having large areas. In this manner, it is possible to configure a pressure contact-type semiconductor module having an external electrode configuration with a large area, which is indispensable to large capacity systems.

In Embodiment 1, a case was described in which a female screw 24c was formed in the inner peripheral surface of the electrode plate portions 24 of the electrode plates 23 joined to the columnar conductors 18 of the semiconductor units 2A and 2B, but the configuration is not limited thereto.

For example, a male screw portion may be formed on the outer peripheral surfaces of the electrode plate portions 24, and according to this, the male screw members 25 may be omitted and the female screw portions 31f of the pressure contact adjustment members 3A and 3B may be directly screwed together with the male screw portions of the electrode plate portions 24. Alternatively, male screw portions protruding downward may be formed on the pressure contact adjustment members 3A and 3B, and the male screw portions may be screwed together with the female screw portions 24c of the electrode plate portions 24 of the electrode plates 23. That is, any configuration in which the pressure contact adjustment members 3A and 3B are screwed into the electrode plates 23 can be adopted.

Figure 4:
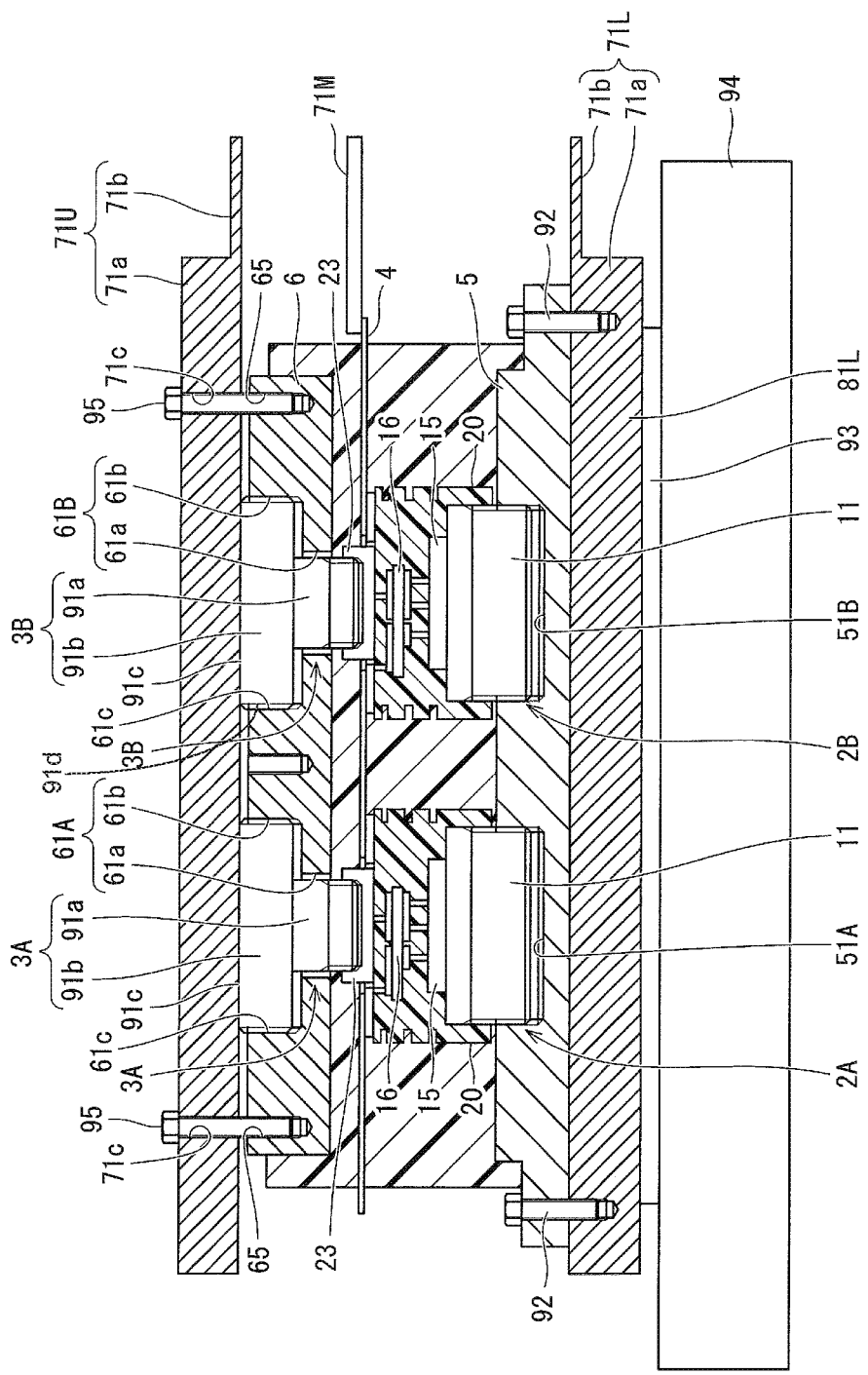
FIG. 4 is a cross-sectional view showing Embodiment 2 of a pressure contact-type semiconductor module according to the present invention.

Next, Embodiment 2 of the present invention will be explained with reference to FIG. 4.

In Embodiment 2, a semiconductor stack can be configured without pressure contact using an external pressure contact mechanism.

In other words, in Embodiment 2, the external pressure contact mechanism 80, and the male screw members 25 constituting the electrode plates 23 of the semiconductor units 2A and 2B are omitted from the configuration of the pressure contact-type semiconductor module of Embodiment 1. As shown in FIG. 4, the pressure contact adjustment members 3A and 3B are formed in a bolt shape having a male screw portion 91a that is screwed together with a female screw portion 24c of a cylindrical portion 24a of an electrode plate portion 24 of an electrode plate 23, and a cap portion 91b that is formed at one end of the male screw portion 91a. Male screw portions 91d are formed in the outer peripheral surfaces of the cap portions 91b of the pressure contact adjustment members 3A and 3B, with the top surfaces of the cap portions being pressure contact-receiving surfaces 91c.

Both junction attachment holes 61A and 61B of the second pressure contact electrode plate 6 have formed therein small diameter portions 61a through which the male screw portions 91a of the pressure contact adjustment members 3A and 3B are inserted, and large diameter portions 61b through which the cap portions 91b are inserted. Here, the depth of the large diameter portions 61b is shallower than the height of the cap portions 91b of the pressure contact adjustment members 3A and 3B. The inner peripheral surfaces of the large diameter portions 61b have formed therein female screw portions 61c that are screwed together with the male screw portions 91d formed on the outer peripheral surfaces of the cap portions 91b of the pressure contact adjustment members 3A and 3B.

The side of the first pressure contact electrode plate 5 opposite to where the semiconductor units 2A and 2B are located is bolted by fixing bolts 92 to the first lead-out electrode plate 71L. The side of the first lead-out electrode plate 71L opposite to the first pressure contact electrode plate 5 is linked to a cooling fin 94 with an insulating layer 93 therebetween.

On the other hand, the male screw portions 91a of the pressure contact adjustment members 3A and 3B are screwed together with the female screw portions 24c of the cylindrical portions 24a of the electrode plate portions 24 of the electrode plates 23 from above the second pressure contact electrode plate 6 and through the junction attachment holes 61A and 61B, in a state in which the second pressure contact electrode plate 6 is placed on the electrode plates 23 of the semiconductor units 2A and 2B such that the junction attachment holes 61A and 61B are coaxial. In this state, the lead-out electrode plate 71U is placed over the second pressure contact electrode plate 6 so as to contact the pressure contact-receiving surfaces 91c of the pressure contact adjustment members 3A and 3B, and the fixing bolts 95 are passed into from above through holes 71c formed in the lead-out electrode plate 71U and screwed together with the female screw portions 65 formed in the second pressure contact electrode plate 6, thereby bolting together the lead-out electrode plate 71U and the second pressure contact electrode plate 6.

In this manner, the cap portions 91b of the pressure contact adjustment members 3A and 3B are sandwiched between the second pressure contact electrode plate 6 and the lead-out electrode plate 71U, and thus, the second lead-out electrode plate 71U is pressed onto the pressure contact-receiving surfaces 91c of the pressure contact adjustment members 3A and 3B. Thus, a semiconductor stack is formed by integrating the following in order from the bottom: the first lead-out electrode plate 71L, the first pressure contact electrode plate 5, the semiconductor units 2A and 2B, the pressure contact adjustment members 3A and 3B, the second pressure contact electrode plate 6, and the second lead-out electrode plate 71U.

According to Embodiment 2, it is possible to apply the necessary contact pressure force to the pressure contact-receiving surfaces 91c of the pressure contact adjustment members 3A and 3B to achieve integration by merely fixing the second pressure contact electrode plate 6 to the second lead-out electrode plate 71U using the fixing bolts 95, without the use of an external pressure contact mechanism, and it is possible to manufacture with ease a semiconductor stack that can handle a large current with a simple structure. Therefore, it is possible to achieve a simpler configuration than with Embodiment 1.

In Embodiment 2, a case was described in which the female screw portions 24c were formed in the inner peripheral surfaces of the cylindrical portions 24a of the semiconductor units 2A and 2B, but the configuration is not limited thereto. Male screw portions may be formed on the outer peripheral surfaces of the cylindrical portions 24a, and in accordance with this, cylindrical portions with female screw portions formed on the inner peripheral surface may be provided instead of the male screw portions 91a of the pressure contact adjustment members 3A and 3B, and the female screw portions of the cylindrical portions may be screwed together with the male screw portions of the cylindrical portions 24a.

In Embodiments 1 and 2, cases were described in which the power semiconductor chips installed in the semiconductor chips 15 in the semiconductor units 2A and 2B are constituted of wide bandgap semiconductors, but the configuration is not limited thereto, and a power semiconductor made of Si can be used.

In Embodiments 1 and 2, cases were described in which two semiconductor units 2A and 2B are provided, but the configuration is not limited thereto, and one semiconductor unit or three or more semiconductor units may be disposed between the first pressure contact electrode plate 5 and the second pressure contact electrode plate 6.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A pressure contact-type semiconductor module, comprising:
    a plurality of semiconductor units disposed side-by-side, each of the semiconductor units including:
        a semiconductor device substrate;
        a first electrode formed below the semiconductor device substrate, the first electrode being electrically connected to the semiconductor device substrate;
        a second electrode formed above the semiconductor device substrate, the second electrode being electrically connected to the semiconductor device substrate;
        an electrode plate electrically connected to the second electrode; and
        a pressure contact adjustment member screwed into the electrode plate, the pressure contact adjustment member having a top surface as a pressure contact-receiving surface to which a lead-out electrode plate that is common to the plurality of semiconductor units is pressure-contacted,
    wherein the respective pressure contact adjustment members are screwed into the corresponding electrode plates such that levels of the respective top surfaces of the pressure contact adjustment members in the plurality of semiconductor units are adjustable to match a reference pressure contact plane so that contact pressures in the respective top surfaces applied by the lead-out electrode plate are substantially the same among the plurality of semiconductor units.

2. The pressure contact-type semiconductor module according to claim 1, wherein in each of the plurality of semiconductor units, the electrode plate has a male screw portion, and the pressure contact adjustment member has a female screw portion that is screwed together with the male screw portion.

3. The pressure contact-type semiconductor module according to claim 1, wherein in each of the plurality of semiconductor units, the electrode plate includes:
    an electrode plate portion in a form of a bottomed cylinder that is connected to the second electrode; and
    a male screw member having a male screw portion that is screwed together with a female screw portion formed in an inner peripheral surface of the electrode plate portion.

4. The pressure contact-type semiconductor module according to claim 1, wherein in each of the plurality of semiconductor units, the pressure contact adjustment member is formed into a ring shape having a female screw portion that is screwed together with a male screw portion of the electrode plate.

5. The pressure contact-type semiconductor module according to claim 1, wherein in each of the plurality of semiconductor units, the electrode plate has a female screw portion, and the pressure contact adjustment member has a male screw portion that is screwed together with the female screw portion of the electrode plate.

6. The pressure contact-type semiconductor module according to claim 1, further comprising:
    a first pressure contact electrode plate in which a plurality of female screw portions are formed, the female screw portions being respectively screwed together with male screw portions that are formed in the respective first electrodes of the plurality of the semiconductor units so as to support and connect the plurality of semiconductor units; and
    a second pressure contact electrode plate having a plurality of female screw portions, the female screw portions being respectively screwed together with male screw portions that are formed in respective outer peripheral surfaces of the respective pressure contact adjustment members of the plurality of semiconductor units, wherein in each of the pressure contact adjustment members, the pressure contact-receiving surface protrudes from a top surface of the second pressure contact electrode plate.

7. The pressure contact-type semiconductor module according to claim 6, further comprising:

another lead-out electrode plate that contacts a bottom of the first pressure contact electrode plate, wherein the lead-out electrode plate contacts the pressure contact-receiving surface of each of the pressure contact adjustment members that protrudes further than the second pressure contact electrode plate.

8. The pressure contact-type semiconductor module according to claim 7, further comprising an external pressure contact mechanism that includes a first pressurizing support plate that pressure-contacts a bottom of the another lead-out electrode plate and a second pressurizing support plate that pressure-contacts a top of the lead-out electrode plate so as to sandwich the another lead-out electrode plate and the lead-out electrode plate in a pressurized manner.

9. The pressure contact-type semiconductor module according to claim 8, wherein the external pressure contact mechanism includes stud bolts that connect the first pressurizing support plate and the second pressurizing support plate so as to impart a pressing force onto the another lead-out electrode plate and the lead-out electrode plate, respectively.

10. The pressure contact-type semiconductor module according to claim 7, wherein the lead-out electrode plate is affixed to the second pressure contact electrode plate by a fixing bolts such that a pressing force from the lead-out electrode plate is imparted onto the pressure contact-receiving surface of each of the pressure contact adjustment members.

11. The pressure contact-type semiconductor module according to claim 10, wherein said fixing bolts are passed into from above through holes formed in the lead-out electrode plate and screwed into screw portions formed in the second pressure contact electrode plate.

* * * * *